United States Patent
Apfelbacher et al.

(10) Patent No.: US 7,692,293 B2
(45) Date of Patent: Apr. 6, 2010

(54) SEMICONDUCTOR SWITCHING MODULE

(75) Inventors: Walter Apfelbacher, Freihung (DE);
Norbert Reichenbach, Amberg (DE);
Johann Seitz, Amberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/793,038

(22) PCT Filed: Dec. 17, 2004

(86) PCT No.: PCT/DE2004/002770
§ 371 (c)(1),
(2), (4) Date: Aug. 29, 2008

(87) PCT Pub. No.: WO2006/063539
PCT Pub. Date: Jun. 22, 2006

(65) Prior Publication Data
US 2009/0008772 A1    Jan. 8, 2009

(51) Int. Cl.
*H01L 29/49* (2006.01)
*H01L 29/74* (2006.01)
*H01L 31/111* (2006.01)
*H01L 29/73* (2006.01)
*H01L 23/52* (2006.01)
*H01L 23/10* (2006.01)
*H01L 23/12* (2006.01)
*H01L 23/34* (2006.01)
*H01L 23/48* (2006.01)
*H01L 29/40* (2006.01)

(52) U.S. Cl. .......... 257/710; 257/150; 257/151; 257/177; 257/178; 257/179; 257/180; 257/181; 257/182; 257/691; 257/711; 257/718; 257/719; 257/726; 257/727; 257/785; 257/E23.044; 257/E23.071

(58) Field of Classification Search .......... 257/150–151, 257/177–182, 691, 718–719, 726–727, E23.044, 257/E23.071, 710–711, 785
See application file for complete search history.

(56) References Cited

U.S. PATENT DOCUMENTS 3,858,096 A    12/1974    Kuhrt et al. ................. 257/746
(Continued)

FOREIGN PATENT DOCUMENTS

DE    196 17 055    6/1997
(Continued)

OTHER PUBLICATIONS

International Search Report dated Dec. 17, 2004.
(Continued)

*Primary Examiner*—Ida M Soward
(74) *Attorney, Agent, or Firm*—Harness, Dickey & Pierce, P.L.C.

(57) ABSTRACT

A semiconductor switching module includes a power semiconductor element that is embodied in planar technology. In at least one embodiment, the power semiconductor element is provided with a base layer, a copper layer, and at least one power semiconductor chip that is mounted on the copper layer, and another electrically conducting layer which covers at least one load terminal of the power semiconductor chip. According to at least one embodiment of the invention, devices are provided for safely connecting the load terminal to a load circuit. The devices are configured such that a contact area thereof presses in a planar manner onto the electrically conducting layer.

19 Claims, 3 Drawing Sheets

U.S. PATENT DOCUMENTS

| | | | | | |
|---|---|---|---|---|---|
| 4,670,833 | A | * | 6/1987 | Sachs | 363/132 |
| 5,444,295 | A | * | 8/1995 | Lake et al. | 257/678 |
| 5,463,250 | A | * | 10/1995 | Nguyen et al. | 257/698 |
| 5,519,253 | A | * | 5/1996 | Lake et al. | 257/724 |
| 5,523,620 | A | * | 6/1996 | Eytcheson et al. | 257/690 |
| 5,544,412 | A | * | 8/1996 | Romero et al. | 29/832 |
| 5,635,427 | A | | 6/1997 | Takahashi | 438/107 |
| 6,127,727 | A | * | 10/2000 | Eytcheson | 257/692 |
| 6,272,015 | B1 | * | 8/2001 | Mangtani | 361/707 |
| 6,297,549 | B1 | * | 10/2001 | Hiyoshi | 257/703 |
| 6,359,331 | B1 | * | 3/2002 | Rinehart et al. | 257/691 |
| 6,424,026 | B1 | * | 7/2002 | Mangtani | 257/675 |
| 6,774,465 | B2 | * | 8/2004 | Lee et al. | 257/671 |
| 6,845,012 | B2 | * | 1/2005 | Ohkouchi | 361/704 |
| 7,138,708 | B2 | * | 11/2006 | Topp et al. | 257/685 |

FOREIGN PATENT DOCUMENTS

| | | |
|---|---|---|
| DE | 196 17 055 C1 | 6/1997 |
| DE | 197 07 514 | 8/1998 |
| DE | 197 07 514 A1 | 8/1998 |
| DE | 101 21 970 | 11/2002 |
| DE | 101 21 970 A1 | 11/2002 |
| DE | 103 50 770 | 9/2004 |
| DE | 103 50 770 A1 | 9/2004 |
| EP | 0 285 074 | 10/1988 |
| EP | 0 285 074 B1 | 10/1988 |
| EP | 1 318 545 | 6/2003 |
| EP | 1 318 545 A1 | 6/2003 |
| EP | 1 391 966 | 2/2004 |
| EP | 1 391 966 A1 | 2/2004 |
| FR | 1 484 261 | 6/1967 |
| FR | 1.484.261 A | 9/1967 |

OTHER PUBLICATIONS

International Preliminary Examination Report dated Dec. 17, 2004.

* cited by examiner

SEMICONDUCTOR SWITCHING MODULE

PRIORITY STATEMENT

This application is the national phase under 35 U.S.C. §371 of PCT International Application No. PCT/DE2004/002770 which has an International filing date of Dec. 17, 2004, which designated the United States of America, the entire contents of which are hereby incorporated herein by reference.

FIELD

At least one embodiment of the present invention relates to a semiconductor switching module.

BACKGROUND

Semiconductor switching modules are employed when the situation involves switching load currents of up to several hundred amperes frequently and virtually noiselessly, at operating voltages of a few hundred volts.

In this case, semiconductor switching modules can be produced for example according to so-called bonding technology. In this case, the actual power semiconductor element, comprising a base substrate and the power semiconductor chip fitted thereon and also further components, is connected to terminal elements by means of corresponding bonding wires. The terminal elements are routed outward through the module housing of the semiconductor switching module, such that corresponding interconnection with the load circuit to be switched can be performed. For electrical insulation both of the components and of the bonding wires, a large part of the interior space of the module housing is filled with an insulating potting composition. For heat dissipation purposes, moreover, an appropriately dimensioned heat sink is fitted on that side of the base substrate which is opposite to the side with the power semiconductor chip.

As an alternative, the power semiconductor element of such a semiconductor switching module can also be constructed according to so-called planar technology. Such a planar construction of a power semiconductor element is known from WO 03/030247, for example. In this reference, the components are fitted on the base substrate comprising a ceramic base with copper layers applied on both sides. The components can then be contact-connected to one another or be connected to terminal elements areally and without additional wires by way of further layers composed of electrically insulating and electrically conductive materials that are applied to the surface. The wirings required in bonding technology, and indeed those required in conventional soldering technology, are largely obviated through the use of such power semiconductor elements embodied in planar technology.

In addition, the insulation between the individual components and the electrically conductive layers is brought about here solely by the electrically insulating layers, such that an additional potting composition can be dispensed with. The electrically insulating layers thus serve, particularly when they extend virtually over the entire surface of the power semiconductor element, for increasing the creepage paths between the various conductive layers and components. Consequently, semiconductor switching modules can be produced more compactly, with less complexity and hence also more cost-effectively.

Power semiconductor chips in semiconductor switching modules, for example in the form of thyristors, have a control terminal for switching the load currents, a control signal being applied to said control terminal. Depending on the control signal, a load current passed via a load terminal and a base of the power semiconductor chip is then controlled and thus switched. In this case, the load circuit and the control signal can be connected by way of the bonding or planar technology described above.

Connection by way of bonding technology has the disadvantage, however, that it is very complicated. Connection exclusively by way of planar technology has the disadvantage that the planar electrically conductive layers for connecting the load and control terminals cover parts of the surface of the power semiconductor element and complex and complicated planar structures thus arise.

SUMMARY

At least one embodiment of the present invention specifies a semiconductor switching module in which the connection of the load terminals, and indeed of the control terminals overall is less complicated.

In at least one embodiment, a semiconductor switching module comprises a power semiconductor element embodied in planar technology and comprising a base layer, a copper layer, at least one power semiconductor chip fitted on the copper layer, and also a further electrically conductive layer, which covers at least one load terminal of the power semiconductor chip and is thus in electrical contact therewith, and means for reliably connecting the load terminal to a load circuit to be switched, wherein the means are formed such that they press with a contact area areally onto the electrically conductive layer.

The semiconductor switching module according to at least one embodiment of the invention thus enables simple connection of the load circuit to be switched to the load terminal of the power semiconductor chip. The devices provided for this, according to at least one embodiment of the invention, enable a pressure contact-connection for reliable connection which is less complicated than known bonding or soldering connections.

The further electrically conductive layer produced in planar technology, which layer may include copper, in particular, in this case additionally serves as surface protection for the terminals of the power semiconductor chip. This applies to the load terminal, in particular, which is correspondingly stressed by the pressure contact-connection. Moreover, with the further electrically conductive layer it is possible to produce a very planar surface that ensures a reliable whole-area support for the contact area of the device.

The area-like pressure contact-connection in conjunction with a power semiconductor element produced in planar technology thus has the advantage over the point-like connection types bonding and soldering of a significantly higher load-change endurance. This is important particularly for applications with momentarily high loadings such as exist for example in soft starters.

In order to achieve a smallest possible contact resistance, the contact area preferably has an area form corresponding to an area form of the load terminal. This pressure contact-connection brought about then with a maximum possible contact area results in a low-loss current transfer between the load terminal of the power semiconductor chip and the load circuit to be connected thereto. The limitations in the surge current carrying capacity that are customary in the case of bonding connections, for example, can thus be avoided.

Preferably, the pressure contact-connection will be effected directly on the power semiconductor chip. Thus, the power semiconductor element can be pressed onto a heat sink, fitted at the opposite side of the power semiconductor element, precisely at the location of the power semiconductor chip. An optimum thermal contact between the ceramic of the power semiconductor element and the heat sink is thereby obtained precisely at the location of the power semiconductor chip. It is thus possible to achieve a very good dissipation of power loss from the power semiconductor chip to the heat sink.

If, by contrast, the pressure contact-connection is effected on the power semiconductor element alongside the power semiconductor chip, then the further electrically conductive layer must be extended beyond the surface of the power semiconductor chip in such a way that, with the contact area, it is possible to produce an areal contact alongside the power semiconductor chip.

An electrically insulating layer is arranged between the electrically conductive layer and the surface of the underlying copper layer and the power semiconductor chip, the electrically insulating layer having a window at the location at which the load terminal of the power semiconductor chip is situated, in order to produce an electrical contact-connection between the further electrically conductive layer and the load terminal.

Since the load terminal and the control terminal are in many cases arranged at the power semiconductor chip in such a way that said control terminal is enclosed by the load terminal, with the pressure contact-connection alongside the power semiconductor chip it is possible to achieve a spatial separation between the contact means for the load and control terminals.

In one example embodiment of the semiconductor switching module according to at least one embodiment of the invention, the device(s) comprise at least one contact device and also pre-stress device(s), wherein the pre-stress device(s) press the at least one contact device with its contact area areally onto the further electrically conductive layer. This ensures particularly simple mounting of the semiconductor switching module with few components.

If the load and control terminals are intended to lie together spatially, then it is necessary, particularly in the case of direct contact-connection of the power semiconductor chip, for the contact device(s) to be formed as a hollow body for receiving a contact device for the control terminal. It is thus possible for the power semiconductor element and thus also the semiconductor switching module overall to become smaller, since no additional areas are necessary alongside the power semiconductor chip for the contact-connection.

Misalignments between the surface of the load terminal and the contact area of the contact device(s) can lead to a reduction of these areas that are connected to one another and thus to an increase in the contact resistance of the contact. This can be avoided by the contact means being formed in two parts, for example, wherein the two parts in this case bear against one another with a curvature area. The curvature permits the two parts to be situated relative to one another in such a way that a reliable area contact is achieved.

By virtue of the formation of at least one tapering portion at the contact device(s), in particular between a support of the contact device(s) on the module housing and the actual contact area, misalignments that occur can be compensated for even better by the increased flexibility at said tapering portion.

Moreover, the contact device(s) can include soft-annealed copper. On account of its lower hardness, it can then yield even in the case of slight misalignments and nestle against the contact area.

The pre-stress device is preferably formed as a clip having a bulge particularly at the location at which it comes into contact with the contact device(s). By virtue of the curved surface of the bulge, a point force is exerted directly on the contact means by the pre-stress device. As a result, a reliable contact-connection is achieved and, in addition, a compensation of misalignments is also made possible.

If the pre-stress device have fixing device(s) by which the clip is fixed to a module housing, for example, pressure is exerted on the contact means by the pre-stress means only with the tightening of the fixing device(s).

As an alternative, the fixing device(s) can also be provided in such a way that the clip is connected directly to the power semiconductor element, whereby a module housing can then be dispensed with. Power semiconductor element, contact means and pre-stress device then form one unit which, when finally assembled, already constitutes a reliable pressure contact-connection and thus a functional semiconductor switching module.

Instead of the clip, the pre-stress device itself may also be part of the module housing of the semiconductor switching module. The semiconductor switching module can be produced more cost-effectively through the omission of the otherwise additional pre-stress device.

In a further embodiment, contact device(s) and pre-stress device(s) are formed in one piece as a resilient element. That is to say that the contact-connection and the application of pressure are effected by way of a single component. A more cost-effective semiconductor switching module is thus once again obtained.

If the contact device(s) is formed in solid fashion, moreover, then it can serve as a temporary heat accumulator. Particularly in applications in which very high losses occur momentarily, the temperature of the power semiconductor chip can thereby furthermore be kept in a permissible range. In contrast to the soldering side of the power semiconductor chip, at which the heat must first flow through the ceramic, which has comparatively poor thermal conductivity, in order to reach the heat sink, the contact device(s) is connected to the top side of the power semiconductor chip with only minimal thermal resistance and can thereby momentarily buffer high power losses very effectively. In this case, however, the principal cooling load is still accepted by the heat sink provided on that side of the power semiconductor element which is opposite to the side with the power semiconductor chip. However, the heat sink can then be given smaller dimensions.

BRIEF DESCRIPTION OF THE DRAWINGS

The invention and also advantageous example embodiments thereof are described in more detail below with reference to the following figures, in which.

DETAILED DESCRIPTION OF THE EXAMPLE EMBODIMENTS

Figure 1:
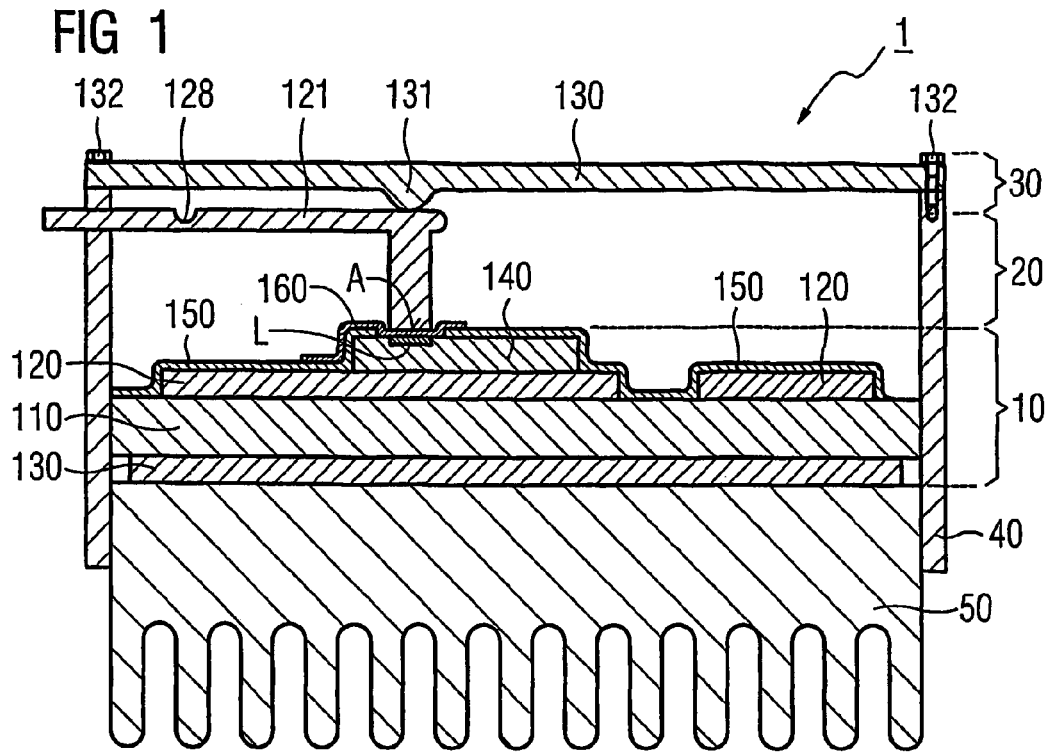
FIG. 1 shows a schematic illustration of a first embodiment of the semiconductor switching module according to the invention.

FIG. 1 schematically illustrates a construction of a semiconductor switching module 1 according to an embodiment of the invention such as would be used for example in soft starters. In this case, the semiconductor switching module according to an embodiment of the invention includes a power semiconductor element 10, and also devices 20 and 30 for reliably connecting the load terminal L to a load current circuit (not specifically illustrated). In the present example, moreover, the semiconductor switching module also has a housing 40 and a heat sink 50, for dissipating the heat brought about by a power semiconductor chip 140.

An embodiment of the present invention is based on the power semiconductor element 10 constructed in planar technology such as is known from WO 03/030247, for example. In this case, the power semiconductor element includes a ceramic carrier 110 with two copper platings 120 and 130. The power semiconductor chip 140 is soldered onto the copper layer 120.

At least parts of the surface of the power semiconductor chip 140 and of the copper plating 120 are covered by an insulating film 150, which is also applied by way of planar technology. At the location of the load terminal L of the power semiconductor chip 140, said electrically nonconductive layer 150 has a window, such that the load terminal L is uncovered.

On the insulating film 150 and the uncovered region of the power semiconductor chip 140, a further electrically conductive layer 160 is applied once again by way of planar technology. Typical layer thicknesses of said electrically conductive layer 160, which preferably also includes copper, are in this case 100-200 μm.

In order to enlarge clearances and creepage paths between the electrically conductive layer 160 and further conductive layers or components, an insulating film (not specifically illustrated) can once again be applied by way of planar technology.

By way of such electrically insulating layers which, if appropriate, are led as far as the edge of the power semiconductor element, it is thus generally possible to reduce the creepage paths between the various layers and/or between various electrical components supplied on the power semiconductor element. These horizontally and vertically effected insulations thus make it possible to reduce the dimensions of the power semiconductor element, which then leads to a more compact semiconductor module.

An embodiment of the invention then provides devices 20 and 30 for reliably connecting the load terminal L to the load circuit to be switched by the power semiconductor chip 140. In the concrete example embodiment, then, by way of the device 30 the electrically conductive contact device 121 is pressed with its contact area A onto the electrically conductive layer 160 situated directly above the load terminal L. In the present example embodiment, this is effected in particular by way of a clip 130, which is screwed to the module housing 40 by a plurality of fixing device, here two screws 132, and which has a bulge 131.

During the assembly of the semiconductor switching module, it is possible, for example on account of dimensional tolerances of the individual components, for misalignments to occur between the power semiconductor element 10, the device 20 and 30, the module housing 40 and the heat sink 50.

As a result, the as a rule large-area contact area A will, under certain circumstances, no longer be pressed onto the further electrically conductive layer 160 over the whole area, which leads to an increased electrical contact resistance and thus to increased thermal losses of the power semiconductor chip 140. In order to avoid such a misalignment, a tapering portion 128 is provided at the contact device 121 in the example embodiment illustrated in FIG. 1. Other measures, such as, for example, the use of soft-annealed copper as material for the contact device 121, are likewise possible. Moreover, the clip 130 is provided with a bulge 131 in order to ensure that the contact means 121 presses on in point fashion and thus reliably makes contact with the further electrically conductive layer 150.

Generally, instead of the clip, further constructional solutions are also conceivable as pre-stress device for the pressure contact-connection of the contact device(s). Thus, instead of the clip, housing parts of the module housing could be formed correspondingly which, during assembly, press the contact device(s) onto the power semiconductor element and thereby bring about the pressure contact-connection. Depending on the embodiment of the semiconductor switching module, the pressure contact-connection is thus effected in a wide variety of ways.

Figure 2:
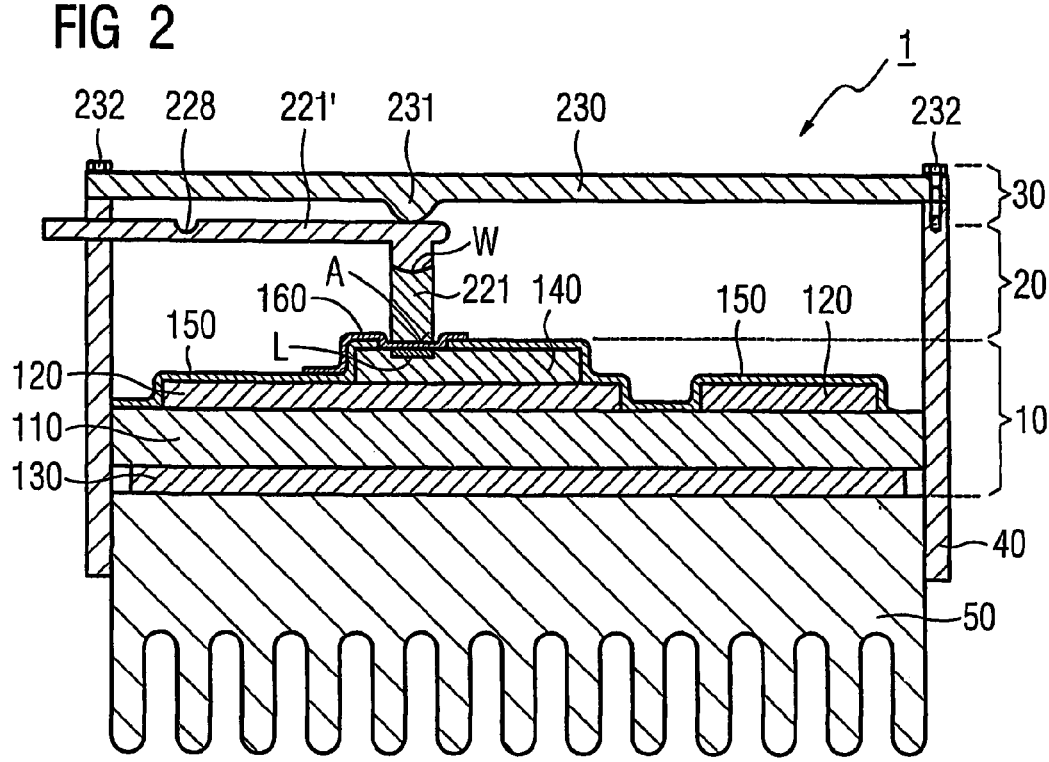
FIG. 2 shows a schematic illustration of a second embodiment.

A second example embodiment is illustrated in FIG. 2. Here the contact device is formed in two parts: corresponding shaping of the curvature area W of the two part elements 221 and 221' results in sufficient mobility for compensating for possible misalignments between contact device 221 and the power semiconductor element 10.

Figure 3:
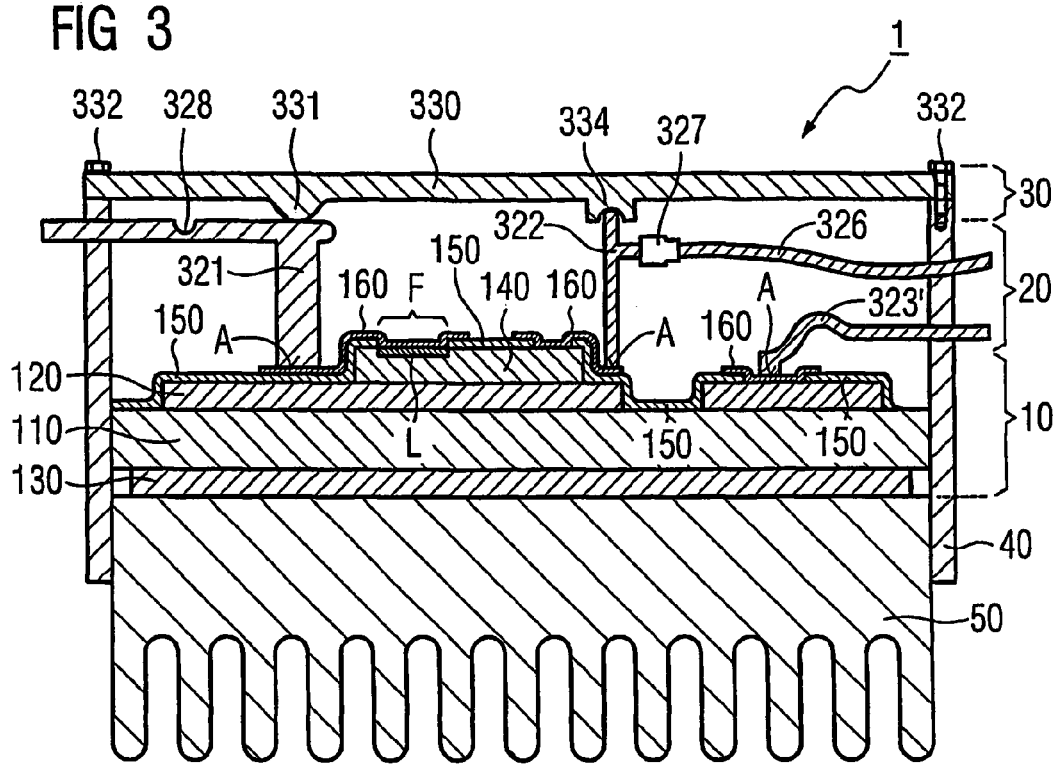
FIG. 3 shows a schematic illustration of a third embodiment.

FIG. 3 illustrates various further contact device and pre-stress device according to an embodiment of the invention. Thus, by way of example, the pressure contact-connection by means of a contact device 321 and the pre-stress device 30 can also be effected alongside the power semiconductor chip 140 instead of on the top side of the power semiconductor chip 140. For this purpose, the electrically conductive layer 160 is continued beyond the power semiconductor chip 140. The contact-connection between contact device 321 and load terminal L is effected by way of the further electrically conductive layer 160 in this case, too.

FIG. 3 illustrates a further embodiment with the contact device 322. The contact device 322, which here is embodied more in bar-shaped fashion, in this case has a corresponding terminal 327 for connecting an electrical conductor 326. The contact device 322 can then be interconnected externally by means of said conductor 326 led through the module housing 40. On the opposite side to the contact area, the contact means 322 is guided in a hollow groove 334. By way of the hollow groove 334, the contact device is strained and, at the same time, slight misalignments can be compensated for.

FIG. 3 illustrates yet another embodiment with the contact device 323. In this case, the contact device 323 is simultaneously the pre-stress device. That is to say that through suitable shaping and clamping in the module housing 40, after assembly the contact means 323 presses directly onto a further electrically conductive layer 160.

Figure 4:
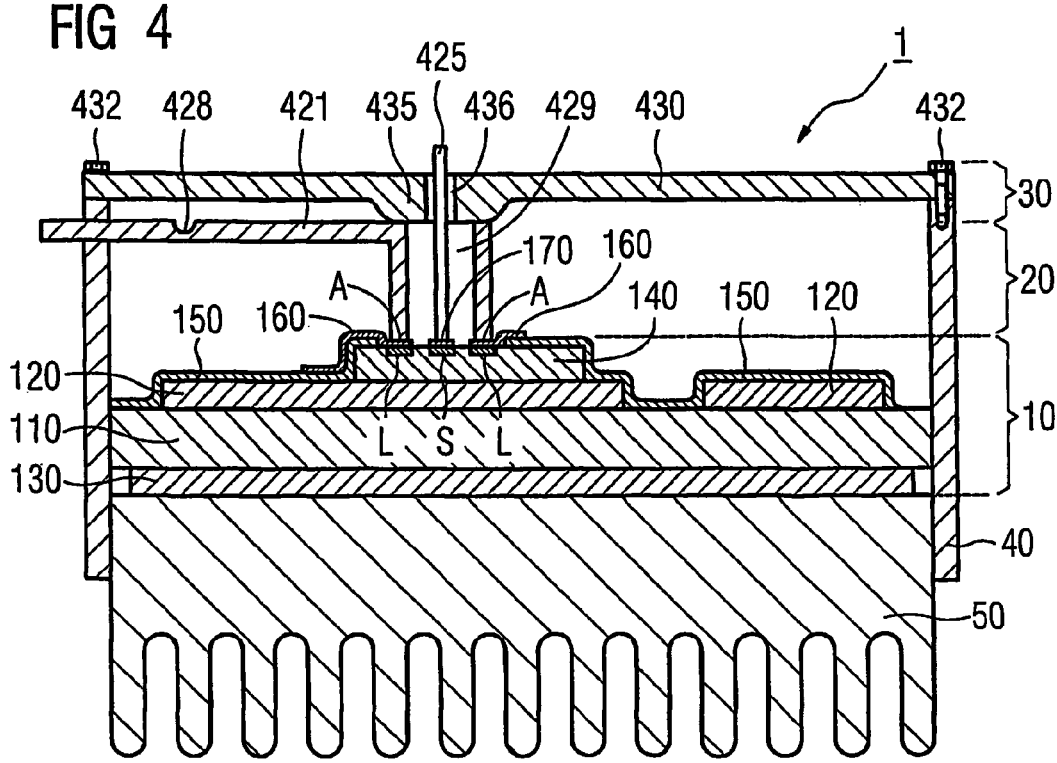
FIG. 4 shows a schematic illustration of a fourth embodiment.
Figure 5:
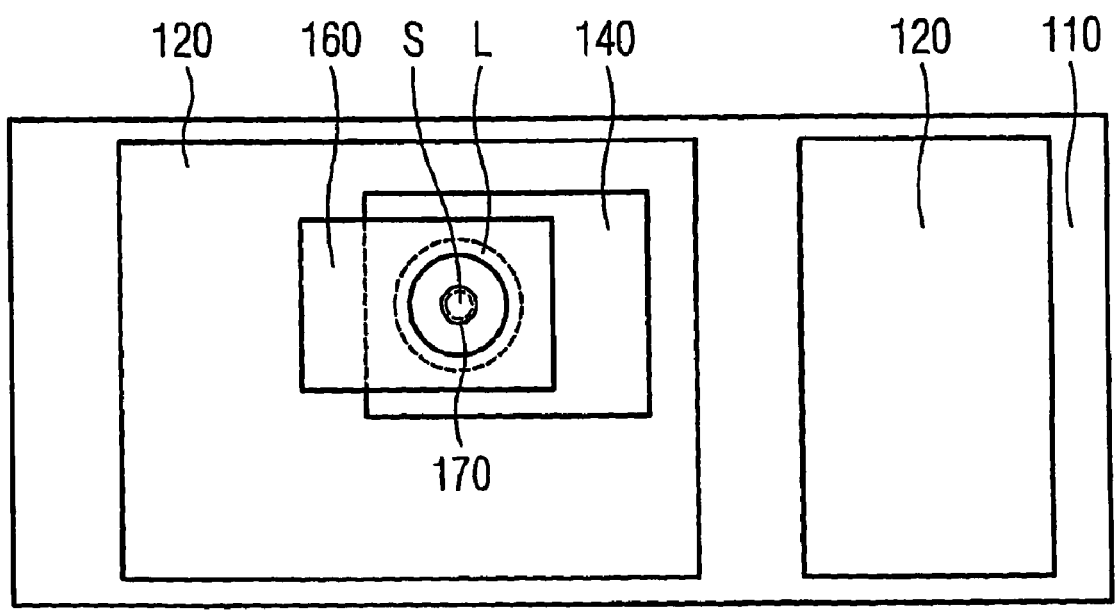
FIG. 5 shows, in a schematic illustration, a plan view of parts of the fourth embodiment.

FIG. 4 shows a further embodiment of a contact device 421 of the semiconductor switching module 1 according to an embodiment of the invention. As indicated in the plan view— illustrated in FIG. 5—of a power semiconductor element 10, the control terminal S is as a rule surrounded by the load terminal L. As a result, a large-area load terminal L that is usually required for switching high currents can be obtained, while a small area is sufficient for the control terminal S. For contact-connection purposes, as illustrated in FIG. 5, a thin electrically conductive layer 170 is then applied only to the control terminal S of the power semiconductor chip 140 by means of planar technology.

Typical layer thicknesses are 100 to 200 μm in this case, too. Consequently, no planar electrically conductive layer for the connection of the control terminal S is led over the rest of the surface of the power semiconductor chip 140. The contact-connection of the control terminal S is effected directly for example by way of the control contact 425 illustrated in FIG. 4, which control contact may be for example a spring contact or a bonding connection. According to an embodiment of the invention, however, the contact device 421 must be formed as a hollow body for this purpose. Thus, the contact area A of the hollow body 421 can be used almost entirely for current feeding. The thermal losses due to current feeding are minimized.

In all of the types of contact-connection described above, whether these are the pressure contact-connections of the load terminals according to an embodiment of the invention or else resilient connections of the control terminals, the further electrically conductive layers 160 applied by planar technology act as a protective layer for the load terminal and the control terminal. As a result, it is possible to reduce in particular the mechanical loadings on the terminals. The largest possible clearances and creepage paths can be achieved by the virtually perpendicular contact-connection. This has an advantageous effect particularly in conjunction with the application of an insulating film for enlarging the clearances and creepage paths.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A semiconductor switching module, comprising:
a power semiconductor element embodied in planar technology and including a base layer, a copper layer, at least one power semiconductor chip fitted on the copper layer, and a further electrically conductive layer, which covers at least one load terminal of the power semiconductor chip; and
means for reliably connecting the load terminal to a load circuit to be switched, the means including at least one contact device and at least one pre-stress device, the at least one pre-stress device being formed such that the at least one contact device presses on a contact area of the electrically conductive layer, with the contact area lying over an area of the load terminal.

2. The semiconductor switching module as claimed in claim 1, wherein the further electrically conductive layer is a copper layer.

3. The semiconductor switching module as claimed in claim 1, wherein the at least one contact device is formed as a hollow body for receiving a control electrode.

4. The semiconductor switching module as claimed in claim 1, wherein the at least one contact device is formed in two parts and the two parts bear against one another with a curvature area.

5. The semiconductor switching module as claimed in claim 1, wherein the at least one contact device includes at least one tapering portion.

6. The semiconductor switching module as claimed in claim 1, wherein the at least one contact device is made of soft-annealed copper.

7. The semiconductor switching module as claimed in claim 1, wherein the at least one pre-stress device includes a clip, having at least one bulge, and at least one fixing device.

8. The semiconductor switching module as claimed in claim 1, wherein the at least one pre-stress device is part of a housing of the semiconductor switching module.

9. The semiconductor switching module as claimed in claim 1, wherein the at least one contact device and the at least one pre-stress device are formed in one piece as resilient contact devices.

10. The semiconductor switching module as claimed in claim 1, wherein a cable is connectable to the at least one contact device.

11. The semiconductor switching module as claimed in claim 1, wherein the at least one contact device is formed in such a way that to serve as a heat accumulator.

12. The semiconductor switching module as claimed in claim 1, wherein a further copper layer is provided on a side of the power semiconductor element opposite to the side with the power semiconductor chip, said further copper layer being connected to a heat sink.

13. The semiconductor switching module as claimed in claim 2, wherein the at least one contact device is formed as a hollow body for receiving a control electrode.

14. The semiconductor switching module as claimed in claim 2, wherein the at least one contact device is formed in two parts and the two parts bear against one another with a curvature area.

15. A semiconductor switching module, comprising:
a power semiconductor element including a base layer, a copper layer, at least one power semiconductor chip on the copper layer, and a further electrically conductive layer, to cover at least one load terminal of the power semiconductor chip;
at least one contact device; and
at least one pre-stress device, the at least one pre-stress device being formed such that a contact area of the at least one contact device presses in a planar manner onto the further electrically conductive layer.

16. The semiconductor switching module as claimed in claim 15, wherein the further electrically conductive layer is a copper layer.

17. The semiconductor switching module as claimed in claim 15, wherein the at least one contact device is formed as a hollow body for receiving a control electrode.

18. The semiconductor switching module as claimed in claim 15, wherein the at least one contact device is formed in two parts and the two parts bear against one another with a curvature area.

19. The semiconductor switching module as claimed in claim 15, wherein the at least one contact device includes at least one tapering portion.

* * * * *